United States Patent [19]

Bershteyn

[11] Patent Number: 5,331,570
[45] Date of Patent: Jul. 19, 1994

[54] METHOD FOR GENERATING TEST ACCESS PROCEDURES

[75] Inventor: Michael Bershteyn, Campbell, Calif.

[73] Assignee: Mitsubishi Electric Research Laboratories, Inc., Cambridge, Mass.

[21] Appl. No.: 858,694

[22] Filed: Mar. 27, 1992

[51] Int. Cl.$^5$ .................................. G01R 31/28
[52] U.S. Cl. ............................ 364/489; 364/580; 371/22.1; 371/27
[58] Field of Search ............ 364/488, 489, 490, 491, 364/580; 371/22.1, 22.3, 23, 22.6, 27

[56] References Cited

U.S. PATENT DOCUMENTS

| | | | |
|---|---|---|---|
| 4,625,310 | 11/1986 | Mercer | 371/15 |
| 4,754,215 | 6/1988 | Kawai | 324/73 R |
| 4,802,133 | 1/1989 | Kanuma et al. | 365/230 |
| 4,853,928 | 8/1989 | Williams | 371/15 |
| 4,862,399 | 8/1989 | Smith et al. | 364/580 |
| 5,051,938 | 9/1991 | Hyduke | 364/578 |
| 5,197,070 | 3/1993 | Maeno | 371/22.3 |
| 5,245,543 | 9/1993 | Smayling et al. | 364/468 |

OTHER PUBLICATIONS

"Test Schedules for VLSI Circuits Having Built-In Test hardware" Authors: M. Abadir and M. Breuer, IEEE Transactions on Computers, vol. C-35, No. 4, Apr. 1986, p. 361.

"Test Generation for Data-Path Logic: The F-Path Method" Author: S. Freeman, IEEE Journal of Solid-State Circuits, vol. 23, No. 2, Apr. 1988, p. 421.

"ASIC CAD System Based On Hierarchical Design-For-Testability" Authors: M. Emori, T. Aikyo, Y. Machida and J. Shikatani, 1990 International Test conference, Paper 20.2, 1990 IEEE, p. 404.

"Direct Access 351e5 st Scheme-Design of Block and Core Cells for Embedded ASICS", Authors: V. Immaneni and S. Raman, 1990 International Test Conference, paper 23.3 1990 IEEE, p. 488.

"Cell-Based Test Design method", Authors: K. Sakashita, T. Hashizume, T. Ohya, I. Takimoto and S. Kato, 1989 International Test Conference, Paper 39.3, 1989 IEEE, p. 909.

"Testable Design and Support Tool for Cell Based Test", Authors: T. Ogihara, Y. Koseko, G. Yonemori and H. Kawai, 1990 International Test Conference, paper 46.2, 1990 IEEE, p. 1065.

"Automated Test Pattern Generation for the Cathedral-II/2nd Architectural Synthesis Environment", Authors: J. van Sas, F. Catthoor, P. Vandeput, F. Rossaert and H. De Man, 1991 IEEE, p. 208.

"Hierarchical Test Generation Using Precomputed Tests for Modules" Authors: B. Murray and J. Hayes, 1988 International Test Conference, Paper 14.2, 1988 IEEE, p. 221.

"Multiple Path Sensitization for Hierarchical Circuit Testing", Authors: C-C Su, C. Kime, 1990 Inernational Test Conference, Paper 6.2, p. 152, 1990 IEEE.

"Hierarchical Test Assembly for Macro Based VLSI Design", Authors: J. Leenstra and L. Spaanenburg, 1990 International Test Conference, paper 25.2, p. 520, 1990 IEEE.

"Symbolic Test Generation for Hierarchically Modeled Digital Systems", Authors: P. Anirudhan, P. Menon, 1989 International Test Conference, Paper 21.1, p. 461, 1989 IEEE.

"A Knowledge Based System For Designing Testable VLSI Chips", Authors: M. Abadir and M. Breuer, University of Sourthern California, Los Angeles, Calif., May 13, 1985.

*Primary Examiner*—Thomas G. Black
*Assistant Examiner*—Susan Wieland
*Attorney, Agent, or Firm*—Leydig, Voit & Mayer, Ltd.

[57] ABSTRACT

A method is presented for generating test access procedures for digital circuits embedded within larger circuits. The method of the present invention utilizes logical implication techniques to restrict the set of initial possible signal combinations at the inputs of the circuit. The implications allow values to be calculated from input assignments already made. The implication step also allows the exclusion of other values as a result of other assignments already made. In addition, the method of the present invention includes the performance of a netlist transformation technique to model sequential circuits with iterative arrays for purposes of developing proper input signals and calculating expected output values in accordance with standard test synchronizing procedures.

14 Claims, 4 Drawing Sheets

|  | 0 | 1 | U | X,SP,SJ | 0~ | 1~ |
|---|---|---|---|---|---|---|
| 0 | 0 | 0 | 0 | 0 | 0 | 0 |
| 1 | 0 | 1 | U | X | 0~ | 1~ |
| U | 0 | U | U | 0~ | 0~ | U |
| X, SP, SJ | 0 | X | 0~ | X | 0~ | X |
| 0~ | 0 | 0~ | 0~ | 0~ | 0~ | 0~ |
| 1~ | 0 | 1~ | U | X | 0~ | 1~ |

METHOD FOR GENERATING TEST ACCESS PROCEDURES

TECHNICAL FIELD

This invention relates generally to the generation of test sequences for the testing of digital circuitry and, more particularly, to the generation of test access procedures for functional blocks embedded within a digital circuit. In other words, functional blocks having at least one input or output not directly linked to the circuit primary input or output pins.

BACKGROUND OF THE INVENTION

Circuit testing is an essential step in the production of digital circuits. After the circuit is manufactured, and prior to shipping to users, the circuit is electronically tested by a computerized tester to verify that no faults exist in the circuitry. A sequence of test values are input to the circuit and the resulting values are sensed at the circuit outputs in order to verify the proper operation of the circuit.

The classical approach to testing a circuit is to represent the circuit to be tested as a network of logical primitive elements of a restricted set of types (i.e., AND-gates, OR-gates, inverters, NAND-gates, NOR-gates, flip flops, etc.). Modelling such circuits becomes impractical, however, when the circuit to be tested is large. The task of generating a test sequence becomes especially difficult when a complex functional block is embedded into the circuit. In such cases, in addition to the test sequence designer having to generate a suitable set of test signals for the embedded cell, the programmer must formulate appropriate access procedures. An example of such a circuit is a large memory array embedded within a microprocessor chip.

In order to streamline the process for generating test programs for digital circuits containing embedded functional blocks, circuit test designers have typically adopted the modular approach. This method entails designing test procedures for specific types of blocks and then merging these test procedures with a customized program for transferring the test sequences from the primary input pins of the digital circuit to the inputs of the functional block to be tested and then transferring the output values from the functional block to the primary output pins of the circuit.

In the aforementioned approach to test generation, once the test generation procedures for the types of embedded functional blocks have been designed, the primary problem faced by the test program designer is formulating the set of input signals to the primary inputs which will propagate the test input signals from the input pins of the circuit to the inputs of the embedded block and transport the output signals from the outputs of the embedded block to the primary output pins of the digital circuit.

The problem of generating test sequences for embedded functional blocks in a digital circuit has been given much attention. The testing of embedded blocks requires both verification of the function of the embedded block and identification of a path from the primary inputs of the digital circuit to the inputs of the embedded block and of a path from the outputs of the embedded block to the primary outputs of the circuit.

Several well known methods have been developed for identification of the paths for delivering input signals to the embedded functional block and transferring output signals from the embedded functional block to the output pins of the tested digital circuit. One known method for generating test access procedures, called the "I-path" method, requires the identification of paths by means of which the input test signals can be propagated identically through the circuit to the embedded block. The use of the I-path approach to generating test access procedures is, however, often impractical, since many embedded circuits are not connected to the primary circuit inputs or outputs by I-paths.

A second known method for generating test access procedures is called the "T-path" method. The T-path method allows for transformation of the input values over the access path to the embedded block and transformation of the output values over the access path from the embedded block to the primary output pins of the digital circuit. For each set of input values there is only one set of output values and for each set of output values there is only one set of input values.

Another well known method for generating test access procedure is called the "F-path" method. The F-path approach to identification of access paths to and from an embedded block broadens the acceptable set of input values to any set of inputs which provides a one-to-one dependency between the values input and output at the primary I/O pins of the digital circuit while testing the embedded functional block for operational defects.

Though the aforementioned I-path, T-path and F-path methods present standards for identifying paths from primary inputs to the inputs of an embedded cell and from the outputs of the embedded cell to the primary outputs of the circuit (as well as algorithms for implementing the standards), these well known procedures fail to address the problem of providing an efficient method for automatic generation of test access procedures.

In addition to the previously described software approaches to circuit testing, certain hardware design methods have been developed that implement the I-path or T-path methods of test access procedures by utilizing special test access hardware in the circuit. This specialized hardware is inactive during the normal operation of the circuit. This hardware approach to generating test access procedures is known at the board design level as well. These well known hardware approaches solve the basic problem of providing access to embedded blocks, but suffer from the disadvantage of increased complexity in the circuit, as well as creation of circuit delays which cause additional problems for the test designer.

Other known methods for generating test access procedures have disadvantages in that they will only work in circuits that do not contain feedback loops or reconvergent fanout paths.

One technique for modeling sequential circuits is by means of "iterative arrays." This modeling technique maps the time domain response of a sequential circuit into a space domain response of the iterative array. This approach has been generally adopted for modeling sequential circuits for generating test procedures. For a general description of the iterative array model, please see *Digital Circuit Testing and Testable Design*, by M. Abramovici et al, Computer Science Press, 1990. For iterative array test procedure generation, a synchronous sequential circuit S can be modeled by a pseudocombinational iterative array. This iterative array consists of n copies C1, ..., Cn of the combinational part C of the circuit S. This transformed circuit corresponds to the original circuit in the following manner. If in response to an input sequence x(0) ..., x(n) applied to the circuit S in time frames 1 to n, circuit S produces the output sequence z(0), ..., z(n) and moves into the states y(1), y(2), ..., y(n+1), then in the iterative array model, every circuit C1, ..., Cn will receive signals x(i), y(i) and generate output signals z(i) and y(i+1).

A general method for generating test access procedures is also known, utilizing the well known D-algorithm scheme on an iterative array model of sequential circuits to determine the T-paths for the circuit. State transition diagrams are used to calculate the conditions for justifying the activated paths. However, this general method is highly inefficient for sequential circuits of any practical size and/or complexity.

In the aforementioned general method, complex circuits are handled by either additional test hardware or by describing the circuit at the level of large functional subsystems for which T-path activation procedures have already been formulated. Furthermore, the general method does not take into consideration the possible sequential nature of the embedded block which introduces further timing problems when transporting the output values of the embedded block to the primary output pins of the circuit. Finally, the general method does not account for complex clocking schemes which often accompany many digital circuits and preclude modelling the circuit by iterative arrays.

Thus, it is an object of the present invention to provide a more efficient method for automatically generating access procedures for embedded functional blocks than has been previously known in the art.

Another object of the present invention is to provide a test access generation method which does not impose hardware design requirements on the tested circuit.

SUMMARY OF THE INVENTION

The method of the present invention includes receiving a set of designer-defined test pattern application requirements. Next, the T-paths are determined for transporting the set of input values from the input pins of the circuit to the inputs of the embedded block and passing the resulting output values from the outputs of the embedded block to the output pins of the circuit in specified time frames. The method according to the present invention calculates signal values implied by assignment of certain signal values at fanout points or by including the fanout points in the T-path. In addition, the method of the present invention includes a netlist transformation step for transforming circuits which cannot be represented in the form of an iterative array into circuits allowing such a representation.

More particularly, the present invention recognizes the sequential characteristics typical of many embedded circuits. The method of the present invention considers that in a sequential environment, not necessarily all the input signals of the embedded block can or even should be excited with a test signal during the same time period. Therefore, the new method restricts the set of test inputs to a subset of the total set of combinations in accordance with the sequential characteristics of those embedded circuits.

The present invention not only calculates the strong implications resulting from providing a certain set of logical signal values simultaneously to the circuit, it also computes weak implications. Weak implications result from the inability of the tester to state with certainty the value at an input to a primitive element along the path to an embedded block. If a path cannot be reliably controlled under certain input conditions, it cannot be relied upon to deliver test sequences to the embedded cell and is therefore disregarded when attempting to build T-paths to the inputs of an embedded circuit.

Finally, the present invention provides a special treatment for sequential circuits with serial connection of flip flops controlled by the same clock signal. In particular, the present test generation method accounts for the nature of clocked inputs to sequential elements in a circuit which may cause contradictory values to be calculated for various points in a circuit due to the difference between the time when inputs are clocked or synchronized in a sequential circuit and the time period in the clock cycle in which the output signals are sampled. Separate values are calculated by means of a special netlist transformation for a single output line which provides both a sampled output signal and an input to another sequential element. This prevents an otherwise unavoidable contradiction—between input values and sensed output values calculated for such points—which occurs when applying the standard clocking and sampling scheme for testing circuits. It has been shown that such a representation only increases the size of a typical test model for a circuit by 9 percent. This represents a substantial decrease in computational complexity in comparison to other known methods for dealing with contradictory input and sample values in sequential circuits.

DETAILED DESCRIPTION OF THE PREFERRED EMBODIMENT

Figure 1:
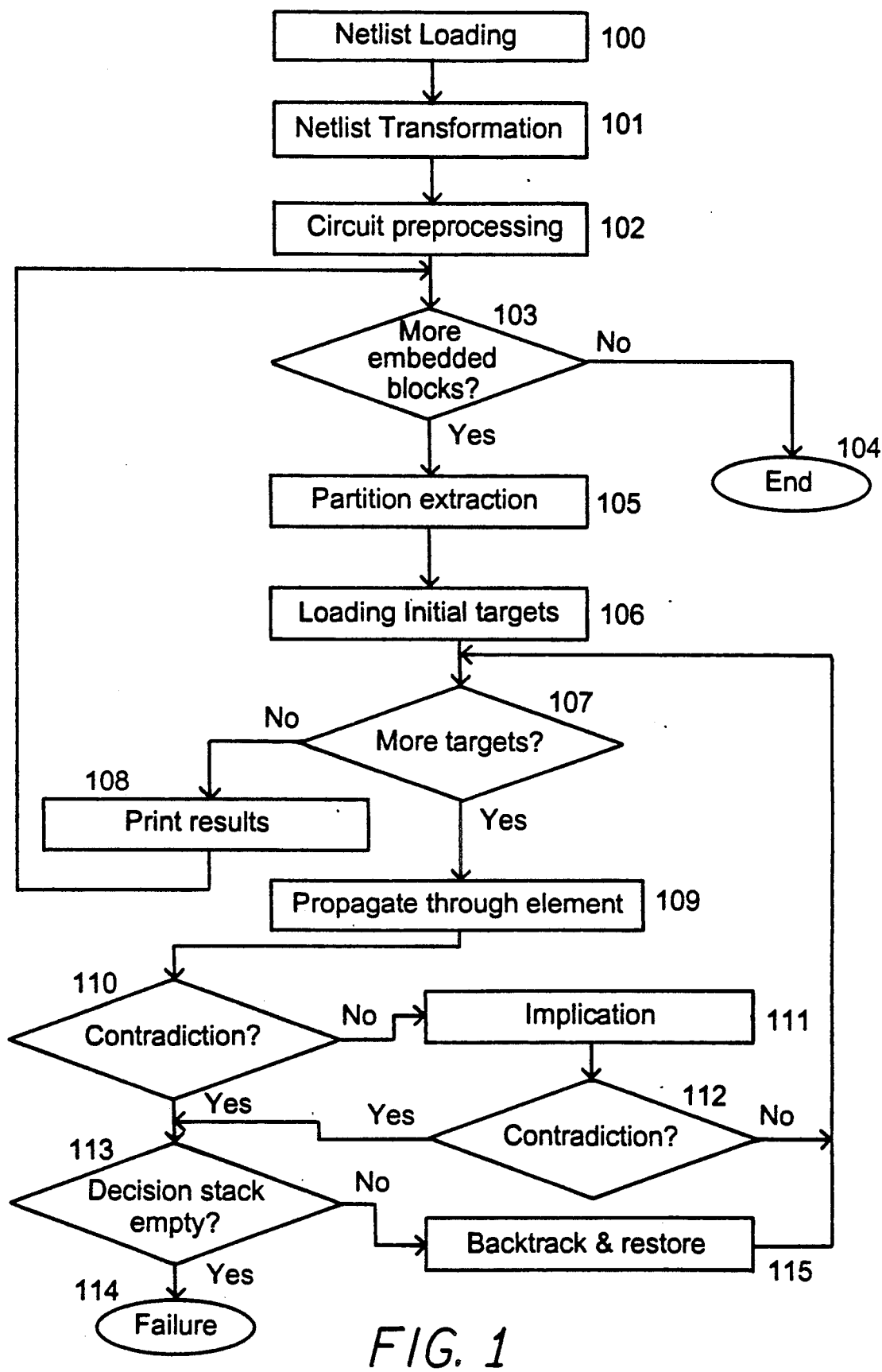
FIG. 1 is a flow diagram for the method of the present invention for generating test access procedures to embedded functional blocks.

Turning first to FIG. 1, a flow diagram is shown illustrating the preferred method of the present invention for generating a test access procedure for testing a digital circuit containing one or more embedded blocks. For the sake of clarity, the netlist production step is not shown. The well-known netlist production stage provides a software representation of the actual digital circuit to be tested and includes a description of the primitive elements from which the digital circuit is constructed including a description of the terminals of primitive elements.

The present description includes certain assumptions. First, it is assumed that a suitable clocking scheme is provided for carrying out the access procedure. A suitable clocking scheme, an example of which is provided in FIG. 4, must provide results during actual hardware testing of the embedded circuit consistent with those predicted by the iterative array model of the circuit created by the Netlist Transformation stage 101 (in the flow diagram of FIG. 1). Second, it is also assumed that test pattern requirements for individual embedded functional blocks have been previously calculated.

In the Netlist Loading stage 100, circuit data is loaded into any suitable computer as would be known to one of ordinary skill in the art. The netlist description consists of a software representation of the connectivity of listed primitive digital circuit elements which are stored in a library. The library typically contains, for example, internal logical descriptions of primitive elements such as inverters 2, AND gates 4 and 6, and random access memory (RAM) 8 which are included in FIG. 2, as well as any other logical elements known to digital circuit designers.

The test access generation process next enters the Netlist Transformation stage 101. The Netlist Transformation stage transforms the portions of the circuit that cannot be properly modeled by iterative array elements for purposes of generating the test access procedures. An example of a digital circuit that cannot be modeled by iterative array elements is two or more serially connected flip flops controlled by the same clock signal. These portions of the circuit are transformed into suitable substitute equivalent circuits which can be modeled in accordance with the iterative array model. Further details regarding the Netlist Transformation stage are discussed in conjunction with the description of FIGS. 6, 7 and 8 below.

Next, during a Circuit Preprocessing stage 102, the test access procedure generator performs scan element substitution. The preprocessor identifies and separates the subcircuits controlled by distinct clock signals and also calculates testability measures. Examples of testability measures procedures that can be used include, but are not limited to, counting the number of primary input values that have to be set in order to control or observe a given signal; calculating the total fanout count of a subcircuit controlling a given circuit element; and a combination of these two procedures. Other testability measures are known to those skilled in the art of digital circuit testing.

The following steps are also included in the Circuit Preprocessing Stage 102. First, redundant data paths such as serially connected buffers are reduced to simplify the circuit without changing its functionality. Second, permanently blocked data paths such as those paths which are held at a permanent value are removed from consideration for the T-path. Finally, scan chains are identified. As is known in the art, scan chains are sequential circuits which are converted by appropriate control signals into shift registers. The shift registers, in turn, are used to shift test patterns into the embedded circuit in a manner known to those skilled in the art.

The next group of steps (103-106) are executed for each identified embedded block in the circuit in order to generate the appropriate test access procedures for testing these embedded circuits. First, it is determined at step 103 whether an embedded block is awaiting generation of a test access procedure. If there are no embedded blocks, then the process for generating test access procedures terminates (step 104). On the other hand, if embedded blocks remain which have not yet been processed by the test access procedure generator, then control passes to the Partition Extraction stage.

The embedded block for which the access procedure is to be generated is referred to hereinafter as the "targeted embedded block." This term should not to be confused with "targets," which are the unpropagated or unjustified signals at the terminals of the circuit elements connecting the targeted embedded block to the primary inputs and outputs of the circuit. In the Partition Extraction stage 105, the processor identifies and temporarily reduces the circuit to those primitive elements that control or belong to the path from the primary inputs of the circuit to the inputs of the targeted block or that either belong to or control the paths from the outputs of the targeted block to the primary outputs of the digital circuit. This stage acts to reduce the scope of the Implication stage 111 described hereinafter.

The next stage 106, referred to in the flow diagram as Loading Initial Targets, incorporates the designer's knowledge of the method for testing the embedded block in an isolated mode, i.e., without the access circuitry to and from the embedded block. This data specifies test pattern application requirements for the targeted block. This data contains both the symbolic values of the signals to be applied to the primary inputs of the embedded block and the time frame in which the specified signals are to be applied. The targeted block data also contains the symbolic values to be observed at the outputs of the embedded block, as well as the time frame in which those signals are to be observed at the outputs of the embedded block. Thus, the Loading Initial Targets stage 106 is analogous to the steps of the "activation" stage of the well-known D-algorithm.

Figure 2:
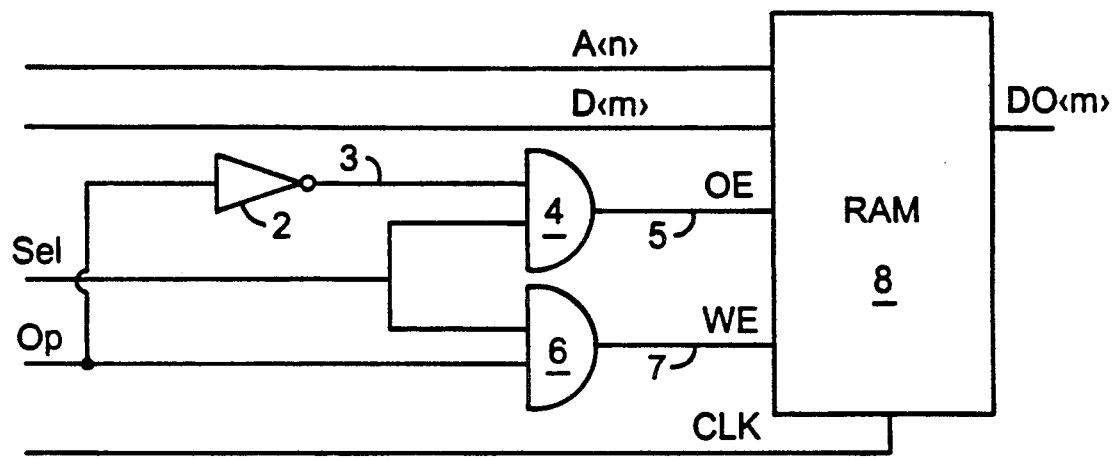
FIG. 2 is an illustrative example of a circuit embodying the restriction that the write enable and the read enable cannot be simultaneously active inputs to the embedded (memory) circuit.

Turning momentarily to FIG. 2, a schematic logic block diagram is shown which illustrates the importance of the initial target loading stage to the present invention. As is known by those skilled in the art, the basic goal of embedded functional block testing is to deliver a standard set of test patterns which have been formulated for testing the specified type of functional block to that type of block embedded within a circuit. Similarly, the designer of a test procedure for the circuit wishes to have the output values from the embedded block transmitted to the primary output pins of the circuit in a manner such that the proper operation of the embedded functional block may be verified by a circuit tester by comparing the values to those expected for the functional block. This comparison may of course include modifying the expected values to account for known transformations occurring to the signals while they pass to the embedded circuit from the primary inputs or to the primary outputs from the outputs of the embedded block. Thus, the access procedure with the exception of expected signal transformations makes the access hardware transparent to the test procedure for the isolated functional block.

Although the preceding explanation of the goal of embedded cell testing completely describes the requirements for testing embedded combinational functional blocks, this description is more restrictive than necessary for embedded blocks whose access is sequential in nature (i.e., where access to certain elements of the functional block is restricted to specified time frames).

In FIG. 2, the particular embedded block is a random access memory (RAM) 8 having address input lines A(0-n), data input lines D(0-m), data output lines DO(0-m), an output enable OE input, a write enable WE input and a clock signal input line CLK. The access circuitry includes the operation line Op connected to the input of an inverter 2 and one of the inputs of an AND gate 6, a line 3 connecting the output of the inverter 2 to one of the inputs of an AND gate 4, and a select line Sel connected to the other inputs of the AND gates 4 and 6. The output of the AND gate 4 is, in turn, connected via a line 5 to the output enable OE input of the RAM 8, and the output of the AND gate 6 is connected via line 7 to the write enable WE input of the RAM 8.

It is clear that due to the manner in which the operation line Op is connected to the access circuitry for the output enable OE and the write enable WE inputs of the RAM 8, one cannot simultaneously create T-paths for delivery of an activation signal to both the output enable OE input and the write enable WE input. Furthermore, there is no need to create such simultaneous paths because at the moment the read or write operation is presented to the RAM 8 via the write enable WE input, the signals on the data output lines DO(0-m) should not be read because their values are undefined.

Therefore, by observing the sequential nature of the circuit shown in FIG. 2, the problem of providing test values to the RAM 8 and reading the output values at the data output lines DO(0-m) is reduced to the following steps. In a first time increment, address and data information and the write enable active signal are provided to the RAM on lines A(0-n), D(0-m) and line 7, respectively. The clock signal on line CLK synchronizes reception of these signals by the RAM 8. In a second time increment (when data is actually read from the data output of the RAM 8), line 5 provides the output enable active signal to the output enable OE input in order to provide valid output data on the lines DO(0-m). The circuit test procedure then compares the input data value received by the RAM 8 in the first time increment to the output value produced on the lines DO(0-m) in the second time increment.

Thus, with respect to the circuit shown in FIG. 2, conditions are processed during the initial target loading stage (106 in FIG. 1) which reflect the operation of the embedded block in isolation. For example, the address and data values are not defined in the second time increment because their values have no effect upon the data output on the lines DO(0-m) while the data output is enabled. Furthermore, as defined by the operational characteristics of the RAM 8 in isolation, the data values on the lines DO(0-m) remain valid as long as the clock signal on line CLK remains passive.

As a result of the initial target loading stage 106, three sets of targets are defined for the stages that follow. First, the symbolic values to be justified or (SJ-frontier) is a subset of circuit signals whose symbolic value must be justified (made to hold a specific value) by the primary input signals. Second, the symbolic value to be propagated (or SP-frontier) is a subset of lines in the circuit whose symbolic values must be propagated on those lines to the primary output signals of the circuit. The third set of targets, the logical value justification (or VJ-frontier), is a subset of lines whose logical values need justification.

At the next stage 107 in the flow diagram of FIG. 1, the test access generation procedure determines whether targets are awaiting consideration for generating a test access procedure for the targeted block. If no targets remain, then control passes to the Print Results stage 108, and the final results for the particular embedded block are printed out. Control then passes to the previously-described stage 103 where the test access procedure generator determines whether an embedded block is awaiting generation of a test access procedure.

The Propagate Through Element stage 109 is similar to the cube intersection in the D-algorithm which is well known to those skilled in the art. For purposes of the Propagate Through Element stage 109 primitive elements of the circuit are represented by sequences of cubes derived from the truth tables or transition tables of the primitive elements. As is known in the art, a cube is a compressed representation of a subset of rows in a truth table that have the same value for the element's output, where 0 and 1 are put into the cube's input signal positions where all the represented rows have the same values 0 or 1, and U (undefined or don't care) is put into a position in the cube representation where both values appear in different rows. For example, two truth table rows 000 and 010 where values correspond to two inputs and the output respectively of an AND gate, can be represented by a cube 0U0.

Another type of cube, referred to as a D-cube, is used to represent the properties of a primitive element for propagating signal values from the input to the output with or without transformation. In this case the positions in the cube corresponding to the propagated values are marked D. The transformed (inverted) value of D is marked $\overline{D}$. For example, 1DD describes an AND gate. If one of the AND gate inputs has value 1, the signal produced at the output is the same as the signal applied to the other input of the AND gate. Similarly, the cube 1D$\overline{D}$ describes a NAND gate. In this case transformation of the signal input does occur.

The Propagate Through Element stage uses a cube in the logical function description of the element (stored in the runtime primitives library) that is compatible with the selected target. For SP and SJ targets, D-cubes are selected. Otherwise, the cube that has the same value as the element's output signal is selected. If several options exist, the program selects the one with the smallest value of corresponding testability measure (i.e. requires manipulation of the smallest number of primary inputs).

The choice of the cubic description to be used is placed on the top of the decision stack. Next, at stage 110 the test access generation procedure attempts to identify signal value contradictions resulting from the instantiation of the cubic description. If no contradiction is identified during instantiation, then control passes to the Implication stage 111.

During the Implication stage, the test access procedure generator determines as many uniquely defined logical values as possible based on currently instantiated logical descriptions of the primitive circuit elements. A unique feature of the Implication stage of the test access procedure generation method of the present invention is that in addition to determining the signal values that are positively defined by the state of the present input values for the circuit, the present invention also identifies signal values that cannot possibly be defined by further instantiation of the input signals.

Figure 3:
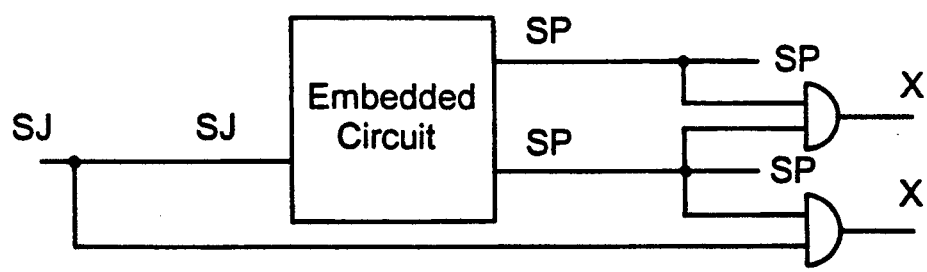
FIG. 3 is a schematic diagram illustrating the signal alphabet for the method of the present invention.

In order to explain this unique principle, the following signal alphabet will be defined for both instantiation and implication. The alphabet includes: SP (symbolic value to be propagated), SJ (symbolic value to be justified), U (unassigned or don't care), X (unknown or unpredictable), 0, 1, CU (positive clock), CD (negative clock), and Z (high impedance). The special meaning of X in embedded cell testing is illustrated in FIG. 3. Besides the usual meaning of an output signal for a primitive circuit element having an incompletely defined truth or transition table, value X also results from logic operations on symbolic values. Such values cannot be predicted because they depend upon the actual, logical values of signals substituted during testing of the embedded circuit instead of the symbolic values that exist at the test assembly stage.

Figures 4, 5:
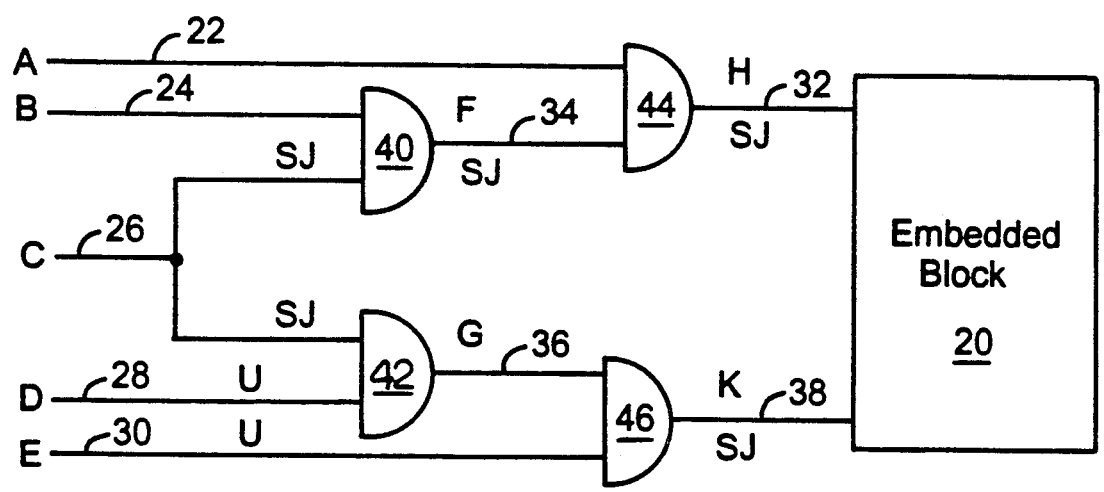
FIG. 4 is a truth table for an AND gate with inputs A and B and output Y showing exemplary logical combinations of the elements of the signal alphabet.
FIG. 5 is a schematic diagram illustrating the implication step of the present method.

FIG. 4 shows the truth table resulting from various logical assignments to the inputs of an AND gate having inputs A and B and an output Y. In the table in FIG. 4, 0~ value (weak zero) indicates that the value at the gate's output may be either 0 or X, but not 1. A value 1~ (weak 1) indicates that the value at the gate's output may be either 1 or X, but not 0. The determination of weak values is generated automatically based on regular truth table analysis such as the one set forth in FIG. 4. Furthermore, the consistency of the simulation technique with the extension of the gates library is ensured.

The calculated weak values are not used for justification of the target values since by definition they cannot provide one of the logic levels. Instead, weak values are utilized during the implication stage to propagate a weak value or detect a contradiction between the calculated weak value and an assigned target value to the same line. This means that a wrong decision has been made during some previous cube instantiation and backtracking will be necessary in order to identify an access path for the targeted block.

The use of the Implication stage 111 will be illustrated by means of an example and the circuit shown in FIG. 5. In FIG. 5, the initial targets are Line 32=SJ and Line 38=SJ. This indicates a desire to justify both of these lines in order to provide paths from the embedded block 20 to primary input lines to the circuit. Assume the following assignments were previously made for justification of target line 32: line 34=SJ, line 26=SJ; however, line 28=U and line 30=U. In this case, the implication from the line 26 will produce line 36=0~ and, thus, line 38=0~ by implication as described above. This contradicts the initial target value SJ for line 38. Backtracking follows immediately without wasting time on further attempts to justify line 38.

Because situations similar to the example above are typical in embedded cell test access procedures generation, and the number of signals with unpredictable (X) values is rather large, the described implication technique allows for a significant reduction of the search space. This in turn enhances the performance of the test access procedure generator.

Returning now to the method illustrated in FIG. 1, if no contradiction is identified during the Implication stage 111, then control returns to the stage 107 for determining whether additional targets are listed for the targeted block. However, if a contradiction is identified in either the Propagate Through Element (instantiation) stage 110 or the Implication stage 112, then control passes to stage 113 where it is determined whether the decision stack is empty. If the decision stack is empty, then a failure to generate a valid access procedure for testing an embedded block is recorded (stage 114). If, however, the decision stack is not empty, then control passes to the Backtrack and Restore stage 115.

During the Backtrack and Restore stage 115, the test access generation process backtracks to the condition that existed prior to execution of the last instantiation which resulted in the contradiction. Control then passes to the previously described decision stage 107 where the test access generator determines whether additional targets remain. If additional targets remain, then control passes to the Propagate Through Element stage 109. On the other hand, if no targets remain, then control passes to the print results stage 108 and the final results for the particular embedded block are printed out.

Then, if additional embedded blocks remain to be processed by the test access generator (as determined at stage 103), control passes to the partition extraction stage 105. If no embedded blocks remain, then the test access generation procedure terminates (stage 104).

Figure 6:
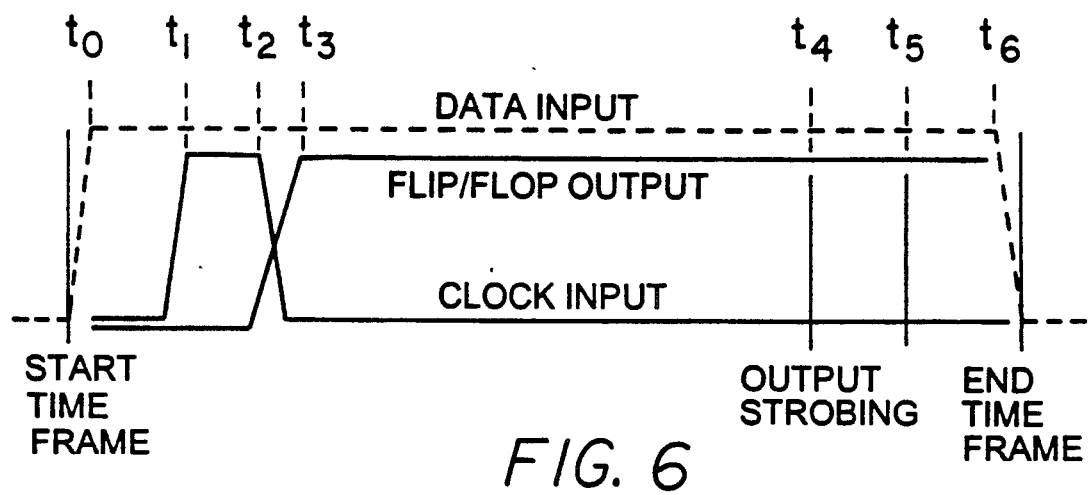
FIG. 6 is a timing diagram illustrating the clocking scheme for which the netlist transformation step of the present invention is employed.
Figure 7:
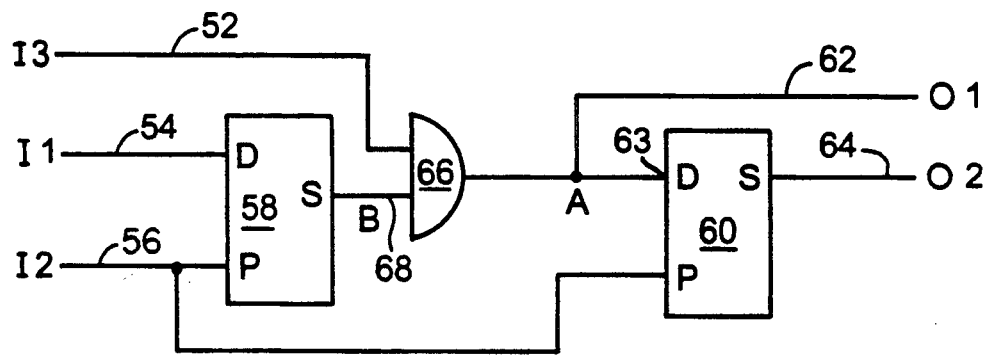
FIG. 7 is an original schematic diagram for a circuit illustrating the netlist transformation step of the present invention.

The present method for generating test access procedures includes a special netlist transformation technique for internally representing signal values when a sequential circuit is controlled by the clocking scheme shown in FIG. 6. As shown in the timing diagram (FIG. 6) and the schematic diagram for a sequential circuit (FIG. 7), the data inputs on input lines 52 and 54 are valid from t0 until t6. The data inputs for the circuit are strobed in the sequential circuits 58 and 60 by the rising edge of the clock input 56 at t1. The outputs of the sequential circuits (i.e., flip flops) 58 and 60 are valid at time t3. The output signals of the circuit of FIG. 7 are sensed at the time period t4 to t5 by a tester connected to lines 62 and 64. Also present in the circuit of FIG. 7 is an AND gate 66 with inputs 52 and 68 and output 62.

When a clock signal—illustrated by the timing diagram of FIG. 6—is applied to the inputs of FIG. 7, a problem occurs with respect to the observed values of the output of the AND gate 66. The data inputs to the flip flops 58 and 60 are strobed and the output of the flip flop 58 provides a new output prior to the strobing by the tester of the output signal on line 62. Therefore, the value received by the D input of flip flop 60 and latched at time t1 is not the same as the signal sensed by the tester on line 62 during the time period t4-t5.

In order to use the iterative array model for this circuit, it is first assumed that the behavior of the flip flops 58 and 60 is described by the equation:

$$\text{If (clock signal at time } P(t-1)), \quad \text{(Eq. 1)}$$
$$\text{then } S(t) = D(t);$$
$$\text{else } S(t) = S(t-1)$$

where t denotes the current time frame and, t−1 denotes the previous time frame. However, assuming I1(t−1)=1, I3(t−1)=1, B(t−1)=0, I1(t)=0, I3(t)=1 and the clock is applied during both time periods to the inputs on line 56, the model based upon the above equation produces B(t)=1, O1(t)=1, and O2(t)=0. At the same time, according to FIG. 6, it is obvious that O1(t) on line 62 is 0—not 1 as predicted by the earlier equation. This is because the value of O1 on line 62 will be sampled after the clock signal has been applied to the flip flop 58 and, therefore, the signal on line 62 must be calculated in view of the new value output on line 68 from the flip flop 58.

If the following different model is assumed for the flip flops:

$$\text{If (clock signal at } P(t)), \quad \text{(Eq. 2)}$$
$$\text{then } S(t) = D(t);$$
$$\text{else } S(t) = S(t-1)$$

it is easy to determine that under the same input conditions, a wrong value will be calculated for O2(t). A correct result can be obtained for the above combination of inputs for the circuit shown in FIG. 7 if flip flop 58 is modeled according to equation 2 and flip flop 60 is modeled according to equation 1. In this case $B(t-1)=1$, $O1(t-1)=1$, $B(t)=0$, $O1(t)=0$ and $O2(t)=1$. However, this model fails if we assume $I1(t-1)=1$, $I3(t-1)=1$, $I1(t)=1$ and $I3(t)=0$. Clearly, the model gives $O2(t)=1$ when in reality $O2(t)=0$.

This exercise indicates that when the clocking scheme of FIG. 6 is used to test a circuit containing flip flops, there is a high probability that the sequential circuit (such as the one shown in FIG. 7) cannot be directly modeled by iterative array. Thus, no sequential test generation method based on an iterative array model, including but not limited to test access procedure generation methods, can be applied under the clocking scheme illustrated in FIG. 6.

One possible solution to this problem is based upon splitting the test cycle into two segments. This solution doubles the amount of computations and further complicates the Propagate Through Element stage 109 described above which is critical to executing the method shown in FIG. 1.

Figure 8:
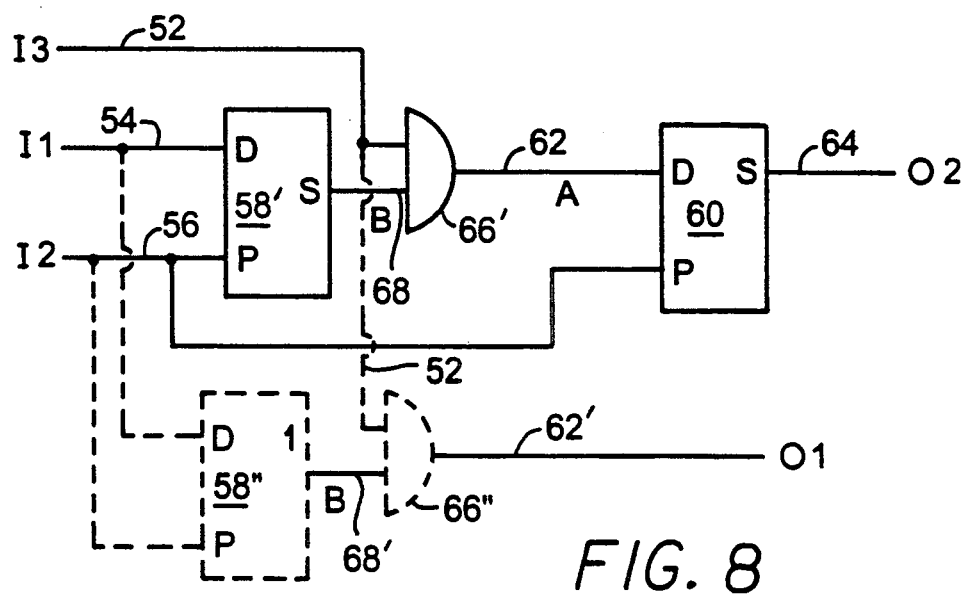
FIG. 8 is a transformed schematic diagram of the circuit of FIG. 7 representing the internal model of the circuit resulting from the netlist transformation step of the present invention.

The more elegant solution to the above problem which will be described hereinafter is to transform the circuit—such as the one shown in FIG. 7—into the logically equivalent circuit, as shown in FIG. 8. The phantom portion of the circuit 80 represents the elements and signals artificially added to the internal netlist representation of the circuit. With the transformed representation (shown in FIG. 8) of the circuit shown in FIG. 7, adequate results for the test access procedure generation method using the clocking scheme of FIG. 6 can be achieved by using Eq. 1 to model the operation of flip flop 58', and Eq. 2 for flip flops 60 and 58''.

The netlist transformation step can therefore be generalized by the following sub-steps. First, for every signal in the circuit, a determination is made whether there is a path from this signal to any primary output leading exclusively through combinational elements. If such a path exists, the signal is marked as "combinationally observable". In FIG. 7, this set of signals consists of those on lines 52, 68 and 62 which are associated with AND gate 66.

Second, for every circuit signal, a determination is made of all the paths leading to this signal from clock primary inputs of the circuit passing exclusively through combinational elements. If such a path exists, the circuit signal will be referred to as a clock signal. Otherwise the circuit signal will be referred to as a data signal. The clock primary inputs for which one of these paths exist are stored. In FIG. 7, this set of clock signals consists of the clock signal I2 on line 56.

Third, for each data input to every circuit element, the set of flip flops (including possibly the same flip flop) from which the data input can be reached exclusively through combinational elements is determined. For flip flop 60 in FIG. 7, it is flip flop 58. Next, the union is determined for the sets of primary input clock signals stored for the clock inputs of each of the sets of flip flops determined in a manner analogous to the second sub-step. This calculated union is stored as a set of clocks driving the data input for each circuit element. In FIG. 7, the data input of flip flop 60 can be reached by the output signal on line 68 through AND gate 66. Flip flop 58 is clocked by the signal I2 on line 56. Therefore, the clock signal I2 is stored as a result of execution of this step for the data input of flip flop 60.

Fourth, for every circuit element a calculation is made of the intersection of sets of clocks driving data identified in step 3 and clock inputs as determined in step 2. If this intersection is not empty, the data input is marked as "sequentially observable". For the circuit of FIG. 7, the intersection of the clocks driving the data input and the clock input to flip flop 60 equals clock signal I2. Therefore, data input 63 to the flip flop 60 is marked "sequentially observable."

Fifth, for every circuit signal, it is determined whether there is a path passing exclusively through combinational elements from this signal to any other signal that is "sequentially observable". If there is such a signal, this signal is marked "sequentially observable" as well. As a result of this step, in FIG. 7 the signals on lines 52 and 68 are marked as sequentially observable since there is a path from those signals to the sequentially observable input 63 of flip flop 60.

Sixth, every element that has an output which is both "combinationally observable" and "sequentially observable" is duplicated into an element that is only combinationally observable (e.g., flip flop 58'') and another element that is only "sequentially observable" (e.g., flip flop 58'). In order to maintain signal input compatibility, fanout is created for the inputs to the duplicated circuit. In addition, if a duplicated element's output is a fanout stem with every branch being either only "combinationally observable" or only "sequentially observable", the fanout connecting branches are split to the corresponding copy of the duplicated element. In FIG. 7, the fanout point is point A. Since flip flop 58 and AND gate 66 have outputs which are both sequentially and combinationally observable (at output O1 and output O2), these circuit elements and their input lines are duplicated in the manner shown in the circuit diagram shown in FIG. 8.

Finally, for every flip flop, if the output of the flip flop is "sequentially observable" but not "combinationally observable", then use is made of the model where change of the output is assumed to occur one time unit later than the application of the clock signal (Eq. 1 of the present example). If the output is "combinationally observable" but not "sequentially observable", then use is made of the model where the change in the output value is assumed to occur during the same time frame as the applied clock signal (Eq. 2 of the present example). Therefore, with respect to the transformed circuit in FIG. 8, equation 1 is used to model the output signal of flip flop 58' and equation 2 is used to model the output signals of flip flops 58'' and 60.

Application of these seven steps to the circuit illustrated in FIG. 7 results in the internal representation for testing purposes shown in FIG. 8. However, this netlist transformation procedure may be generally applied to any circuit having elements whose output are both combinationally and sequentially observable. Application of the netlist transformation procedure described above will result in an internal representation of the circuit which is valid for generating test access procedures for circuits tested under the standard clocking scheme illustrated in FIG. 6.

As to the affect of the netlist transformation stage, it should be noted that even though the representation in the present example of FIGS. 7 and 8 increased in size by about 50 percent due to the duplication of elements, in benchmark circuit testing, the transformation typically increased the size of a circuit by only about 9 percent. This is vastly superior to the increase in complexity caused by other known solutions to the problem of timing—such as the aforementioned split clock cycle scheme.

Though a preferred embodiment of the present invention has been described, it would be obvious to one skilled in the art to substitute certain steps for the ones described above or to rearrange the steps. It is therefore within the scope of the present invention to implement such changes in any obvious manner as would be known to those of ordinary skill in the art.

What is claimed is:

1. A method for generating test access sequences for an embedded block in a digital circuit, said digital circuit having a set of circuit signals including primary inputs for receiving a circuit test sequence, a set of embedded block terminals including inputs and output for the embedded block, primary outputs, and internal signals associated with access circuitry providing a T-path from the primary inputs to the inputs for the embedded block and from the outputs for the embedded block to the primary outputs, said method comprising the steps:

loading a netlist representation of the digital circuit including the embedded block;
   identifying a first set and a second set of terminals from the set of embedded block terminals;
   loading a set of test targets for the embedded block to create a set of terminal signal values for testing the first set and the second set of terminals, wherein said test target loading step comprises defining a set of initial test targets, which includes the steps of:
   specifying in the set of test targets a first test sequence for the first set of terminals, said first test sequences comprising a first set of signal values and a first set of assigned time intervals for applying the first set of signal values; and
   specifying in the set of test targets a second test sequence for the second set of terminals, said second test sequence comprising a second set of signal values and a second set of assigned time intervals for applying the second set of signal values; and
   calculating a set of primary input signal values for the circuit test sequence in accordance with the set of test targets.

2. The method of claim 1 wherein said identifying step comprises observing a sequential nature of the set of embedded block terminals and identifying the first set and second set of terminals in accordance with the sequential nature.

3. The method of claim 2 wherein the the sequential nature pertains to a mode of accessing a write enable terminal and an output enable terminal in a random access memory.

4. The method of claim 1 wherein said test target loading step further comprises defining a set of test access procedure signal values in order to maintain a defined signal value at a specified input to the embedded block in all time frames where the input does not have a value defined by the set of initial targets.

5. The method of claim 1 wherein said test targets include an output signal from the embedded block which must be propagated to a primary output.

6. The method of claim 1 wherein said calculating step comprises deriving a signal value implication which results from applying a set of signal values to the netlist representation of the digital circuit, wherein the signal value implication is based upon an inability to justify a circuit signal by further instantiation of other circuit signals.

7. The method of claim 6 wherein said calculating step comprises removing a circuit signal from further consideration in said calculating step as a result of the signal value implication.

8. The method of claim 1 wherein said test targets include a circuit signal value which must be justified as a symbolic value.

9. The method of claim 1 wherein said calculating step comprising deriving a signal value implication which is based upon a dependence of a circuit signal value on a signal value for an output for the embedded block.

10. The method of claim 9 wherein said calculating step comprises removing a circuit signal from further consideration in said calculating step as a result of the signal value implication.

11. The method of claim 1 wherein said test targets include a circuit signal value which must be justified as a logical value.

12. The method of claim 1 wherein said calculating step comprises deriving a signal value implication which is based upon a dependence of a circuit signal value on a signal value for an input for the embedded block.

13. A method for generating test patterns for a digital circuit having sequential elements, wherein the test synchronization scheme for the sequential circuits comprises applying a set of data values to data inputs to the digital circuit, latching the set of data values by applying clock signals to clock inputs of the digital circuit, and subsequently reading a set of output values of the digital circuit, said method comprising:

receiving an initial netlist representation of the digital circuit;
   transforming the initial netlist representation of the digital circuit to create a model of the digital circuit represented in the form of an iterative array providing model signal values equal to the values expected during testing of the digital circuit under the test synchronization scheme, wherein said transforming step comprises the steps of:
   identifying a portion of the netlist representation of the digital circuit having a signal which is both combinationally observable and sequentially observable; and
   duplicating the portion into a first copy having only a combinationally observable signal and a second copy having only a sequentially observable signal; and
   applying proper model equations for the combinationally observable signal and the sequentially observable signal.

14. A method for generating test patterns for a digital circuit having sequential elements, wherein the test synchronization scheme for the sequential circuits comprises applying a set of data values to data inputs of the digital circuit, latching the set of data values by applying clock signals to clock inputs of the digital circuit, and subsequently reading a set of output values of the digital circuit, said method comprising:

receiving an initial netlist representation of the digital circuit;
   transforming the initial netlist representation of the digital circuit to create a model of the digital circuit represented in the form of an iterative array providing model signal values equal to the values expected during testing of the digital circuit under the test synchronization scheme, wherein said transforming step comprises: the steps of:

first marking all signals of the digital circuit passing exclusively through combinational circuit elements to any primary circuit output;

first storing for each circuit signal in the digital circuit a set of all synchronizing clock primary inputs for the circuit signal passing exclusively through combinational elements;

first determining for every data input of every circuit element, a set of flip flops from which the data input can be reached exclusively through combinational elements;

second storing for each data input of every circuit element the union of the sets of primary input clock signals for each of the sets of flip flops identified in said first determining step;

second marking the data input for each circuit element if the intersection of the clock signals from said first storing step with the clock signals from said second storing step is non-empty;

third marking every circuit signal having a path from the signal to any other signal that is identified in said second marking step which passes exclusively through combinational elements;

duplicating every element that has an output identified in said first marking step and either of said second or third marking step into one circuit element that is only combinationally observable and another equivalent circuit element that is only sequentially observable, creating fanout at its input, and if a duplicated element's output is a fanout stem with every branch being either only combinationally observable or only sequentially observable, splitting the fanout by connecting its branches to the corresponding copy of the duplicated element;

assigning for every sequential element whose output is sequentially observable but not combinationally observable the internal model for the element where the output for the element changes one time unit after application of the clock signal; and assigning for every sequential element whose output is combinationally observable but not sequentially observable the internal model for the element where the output for the element changes during the same time frame as the clock signal.

* * * * *